(12) United States Patent
Chen et al.

(10) Patent No.: US 8,772,066 B2
(45) Date of Patent: Jul. 8, 2014

(54) METHOD FOR HYBRID ENCAPSULATION OF AN ORGANIC LIGHT EMITTING DIODE

(75) Inventors: Jrjyan Jerry Chen, Santa Clara, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/361,637

(22) Filed: Jan. 30, 2012

(65) Prior Publication Data
US 2012/0199872 A1  Aug. 9, 2012

Related U.S. Application Data

(60) Provisional application No. 61/440,701, filed on Feb. 8, 2011, provisional application No. 61/482,869, filed on May 5, 2011.

(51) Int. Cl.
*H01L 21/00* (2006.01)

(52) U.S. Cl.
USPC .......................................................... 438/37

(58) Field of Classification Search
USPC ....................................... 257/100; 438/26, 37
See application file for complete search history.

(56) References Cited

U.S. PATENT DOCUMENTS

| | | | |
|---|---|---|---|
| 7,074,501 B2 | 7/2006 | Czeremuszkin et al. | |
| 7,183,197 B2 | 2/2007 | Won et al. | |
| 7,214,600 B2 | 5/2007 | Won et al. | |
| 7,220,687 B2 | 5/2007 | Won | |
| 7,518,142 B2 | 4/2009 | Hoffmann et al. | |
| 7,951,620 B2 | 5/2011 | Won et al. | |
| 2005/0104516 A1 | 5/2005 | Park et al. | |
| 2006/0078677 A1 | 4/2006 | Won et al. | |
| 2007/0048992 A1 | 3/2007 | Hosokawa et al. | |
| 2007/0222817 A1 | 9/2007 | Kurita et al. | |
| 2007/0290201 A1 | 12/2007 | Hoffmann et al. | |
| 2011/0068332 A1* | 3/2011 | Han et al. .................. | 257/40 |
| 2012/0199872 A1 | 8/2012 | Chen et al. | |

FOREIGN PATENT DOCUMENTS

| | | |
|---|---|---|
| CN | 1317421 C | 5/2007 |
| KR | 1020080075099 | 8/2008 |
| KR | 1020110000818 | 1/2011 |
| KR | 1020110000818 A * | 1/2011 |
| KR | 1020110000818 A * | 6/2011 |

OTHER PUBLICATIONS

International Search Report dated Nov. 13, 2013 for PCT/US13/53743.
International Search Report and Written Opinion dated Sep. 27, 2012 for International Application No. PCT/US2012/023129.

* cited by examiner

*Primary Examiner* — Matthew Reames
*Assistant Examiner* — Nicholas J Choi
(74) *Attorney, Agent, or Firm* — Patterson & Sheridan, LLP

(57) ABSTRACT

Methods and apparatus for encapsulating organic light emitting diode (OLED) structures disposed on a substrate using a hybrid layer of material are provided. The processing parameters used during deposition of the hybrid layer of material allow control of the characteristics of the deposited hybrid layer. The hybrid layer may be deposited such that the layer has characteristics of an inorganic material in some sublayers of the hybrid layer and characteristics of an organic material in other sublayers of the hybrid layer. Use of the hybrid material allows OLED encapsulation using a single hard mask for the complete encapsulating process with low cost and without alignment issues present in conventional processes.

13 Claims, 5 Drawing Sheets

METHOD FOR HYBRID ENCAPSULATION OF AN ORGANIC LIGHT EMITTING DIODE

CROSS-REFERENCE TO RELATED APPLICATIONS

This application claims benefit of U.S. provisional patent application Ser. No. 61/440,701, filed Feb. 8, 2011 and U.S. provisional patent application Ser. No. 61/482,869, filed May 5, 2011, each of which is herein incorporated by reference.

BACKGROUND

1. Field

Embodiments of the invention generally relate to a method and apparatus for encapsulating an organic light emitting diode.

2. Description of the Related Art

Organic light emitting diode (OLED) displays have gained significant interest recently in display applications due to their faster response time, larger viewing angles, higher contrast, lighter weight, low power and amenability to flexible substrates such as compared to liquid crystal displays (LCD). However, OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

FIGS. 1A-C illustrate a conventional process for depositing the encapsulating layers, typically including a first inorganic layer 106 (shown as 106a and 106b), an organic layer 108 (shown as 108a and 108b) and a second inorganic layer 116 (shown as 116a and 116b). The process begins by aligning a first mask 109 over a substrate 100 such that an OLED structure 104 is exposed through an opening 107 unprotected by the mask 109, as shown in FIG. 1A. The first mask 109 defines the opening 107 having a distance 110 from the OLED structure 104 to the edge of the first mask 109. The first mask 109 is typically made from a metal material, such as INVAR®. As illustrated in FIG. 1A, the first mask 109 is utilized to pattern the first inorganic layer 106 (shown as 106a, 106b), such as silicon nitride or aluminum oxide, over the OLED structure 104. The first mask 109 is positioned such that a portion 105 of a contact layer 102 adjacent to the OLED structure 104 is covered by the first mask 109 so that the inorganic layer 106 does not deposit on that portion 105. As illustrated in FIG. 1B, the first mask 109 is removed and replaced by a second mask 114 having an opening 111 smaller than the opening 107 of the first mask 109. The second mask 114 defines the opening 111 having a distance 112, which is shorter than the distance 110 as defined by the first mask 109, from the OLED structure 104 to the edge of the second mask 114. By utilizing the second mask 114, an organic layer 108 (shown as 108a, 108b) is deposited over the first inorganic layer 106. As the second mask 114 has the opening 111 smaller than the first mask 109, the organic layer 108 does not completely cover the underlying inorganic layer 106. The encapsulation of the OLED structure 104 is finished by depositing at least a second inorganic layer 116 (shown as 116a and 116b) over the top of the exposed portion of the first inorganic layer 106 and the organic layer 108 utilizing the first mask 109 as illustrated in FIG. 1C. The second inorganic layer 116 fully encapsulates the organic layer 108 with the first inorganic layer 106, thereby encapsulating the OLED structure 104 while leaving the portion 105 of the contact layer 102 exposed.

The conventional process flow described above has significant challenges preventing commercially viable scaling for use with larger area substrates, such as substrates having a top plan area greater than about 1,500 centimeters square. For example, the two metal masks 109, 114 required for implementing the above described process for such large area substrates are very expensive, and may each exceed $40,000.00 in cost. Additionally, very tight alignment tolerance of each metal mask 109, 114 to the OLED structure 104 is required, generally within 100 µm. As these masks 109, 114 often exceed one meter in length, the masks 109, 114 undergo significant thermal expansion when heated from ambient temperatures to processing temperatures of about 80 degrees Celsius. This significant thermal expansion provides a major challenge for OLED fabricators as to how to prevent alignment loss between the openings 107, 111 formed through the masks 109, 114 and the OLED structure 104. Loss of alignment may result in incomplete encapsulation of the OLED structure 104, which in turn leads to shortened life and diminished performance of the OLED device 104.

Therefore, an improved method and apparatus for encapsulating an OLED structure is needed.

SUMMARY

In one embodiment of the present invention, a method for forming an encapsulating layer on an organic light emitting diode (OLED) substrate comprises forming a first inorganic layer on a region of a substrate having an OLED structure disposed thereon, forming a hybrid inorganic/organic layer on the first inorganic layer, and forming a second inorganic layer on the hybrid inorganic/organic layer.

In another embodiment, a method for forming an encapsulating layer on an organic light emitting diode (OLED) substrate comprises forming a first inorganic sublayer of a hybrid layer on a region of a substrate having an OLED structure disposed thereon, forming an organic sublayer of the hybrid layer on the first inorganic sublayer, and forming a second inorganic sublayer of the hybrid layer on the organic sublayer.

In yet another embodiment, an encapsulating layer on an organic light emitting diode (OLED) substrate comprises a first inorganic sublayer of a hybrid layer formed on a region of a substrate having an OLED structure disposed thereon, an organic sublayer of the hybrid layer formed on the first inorganic sublayer, and a second inorganic sublayer of the hybrid layer formed on the organic sublayer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods and apparatus for encapsulating OLED structures disposed on a substrate using a hybrid layer of material. The processing parameters used during deposition of the hybrid layer of material allow control of the characteristics of the deposited hybrid layer. The hybrid layer may be deposited such that the layer has characteristics of an inorganic material in some sublayers of the hybrid layer and characteristics of an organic material in other sublayers of the hybrid layer. Use of the hybrid material allows OLED encapsulation using a single hard mask for the complete encapsulating process with low cost and without alignment issues present in conventional processes.

Figure 1A:
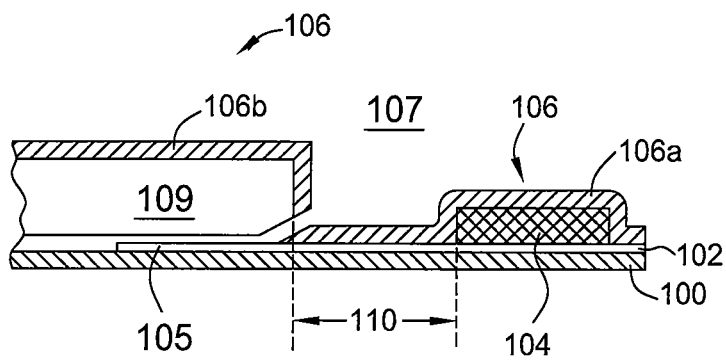
FIGS. 1A-1C illustrate schematic cross-sectional views of an OLED structure during different stages of a conventional encapsulation sequence known in the art.
Figure 1B:
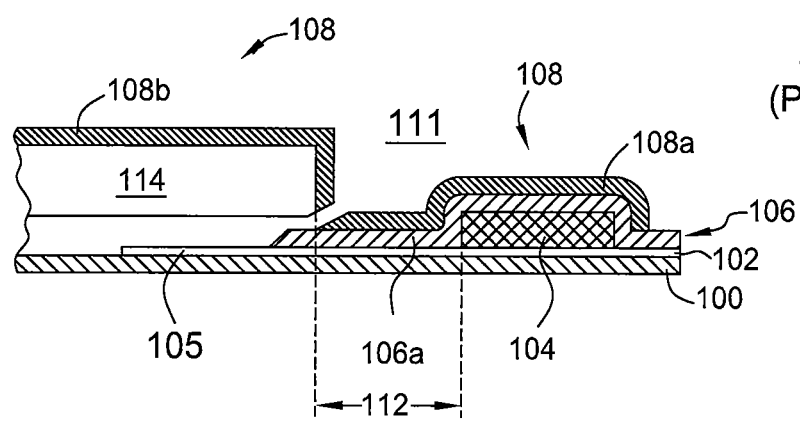
Figure 1C:
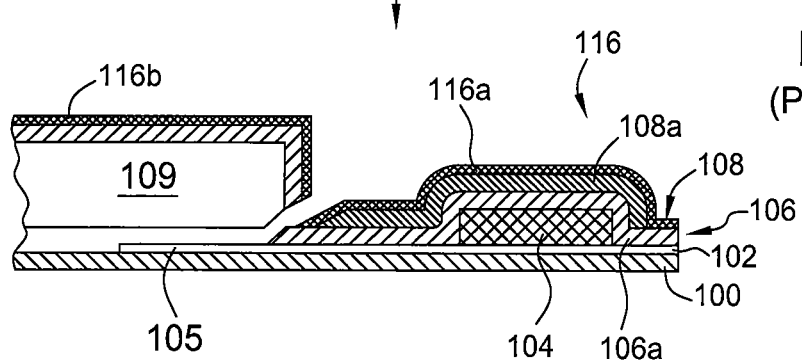
Figure 2:
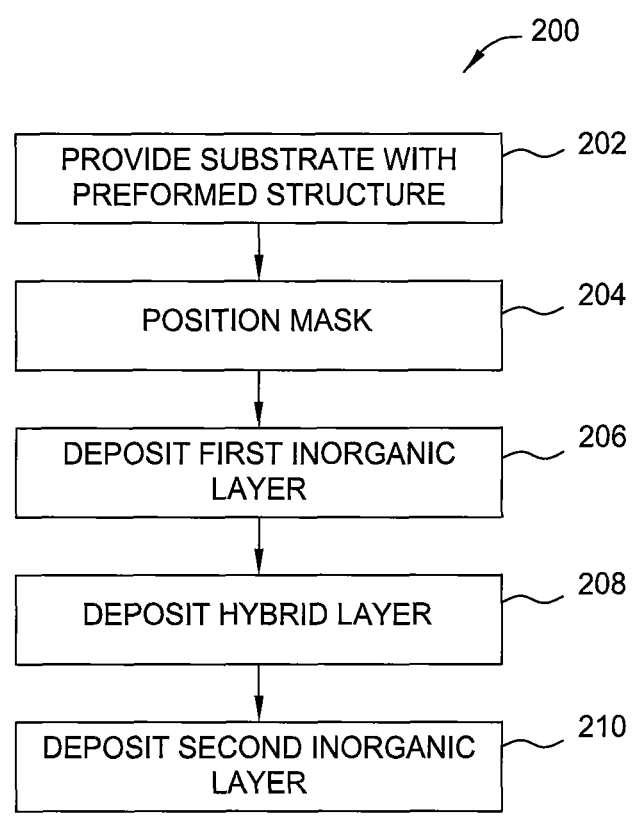
FIG. 2 is a flow diagram of a method for encapsulating an OLED structure in accordance with one embodiment of the present invention.
Figure 3A:
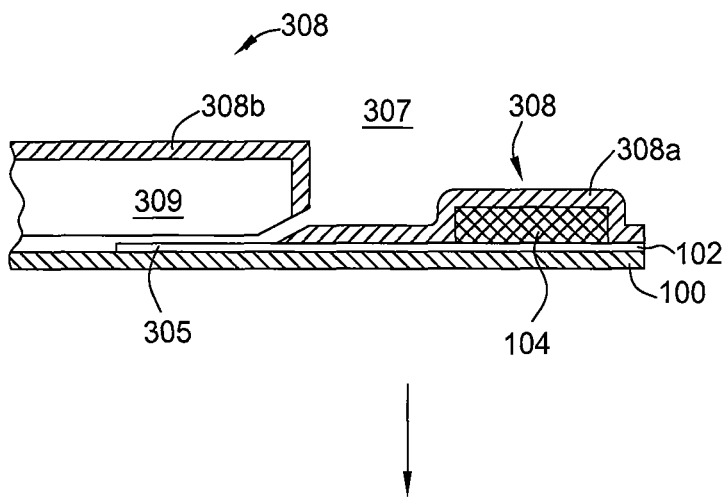
FIGS. 3A-3C illustrate schematic cross-sectional views of an OLED structure during different stages of the method of FIG. 2.
Figure 3B:
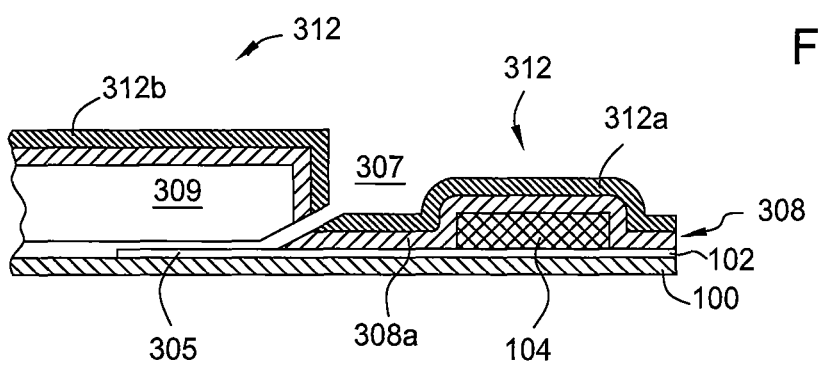
Figure 3C:
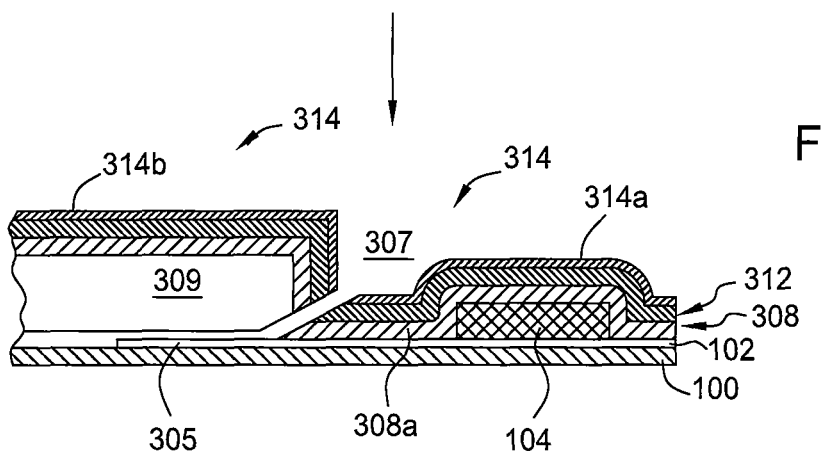

FIG. 2 is a flow diagram of a method 200 for encapsulating an OLED structure disposed on a substrate. FIGS. 3A-3C illustrate schematic cross-sectional views of an OLED structure during different stages of the encapsulation method 200 of FIG. 2. The method 200 starts at process 202 by providing a substrate 100 having a preformed OLED structure 104 disposed thereon. Similar to that discussed above, the substrate 100 may have a contact layer 102 disposed thereon, with an OLED structure 104 disposed on the contact layer 102, as shown in FIG. 3A.

At process 204, a mask 309 is aligned over the substrate 100 such that the OLED structure 104 is exposed through an opening 307 unprotected by the mask 309, as shown in FIG. 3A. The mask 309 is positioned such that a portion 305 of the contact layer 102 adjacent the OLED structure 104 is covered by the mask 309 so that the any subsequently deposited material does not deposit on the portion 305. The mask 309 may be made from a metal material, such as INVAR®.

At process 206, a first inorganic layer 308 is deposited on the substrate 100, as shown in FIG. 3A. The first inorganic layer 308 has a first portion 308a and a second portion 308b. The first portion 308a of the first inorganic layer 308 is deposited through the opening 307 onto a region of the substrate 100 exposed by the mask 309, which includes the OLED structure 104 and a portion of the contact layer 102. The second portion 308b of the first inorganic layer 308 is deposited on the mask 309 covering a second region of the substrate 100, which includes the portion 305 of the contact layer 102. The first inorganic layer 308 is a dielectric layer, such as SiN, SiON, $SiO_2$, $Al_2O_3$, AlN, or other suitable dielectric layers. The first inorganic layer 308 may be deposited by a suitable deposition technique, such as CVD, PVD, spin-coating, or other suitable technique.

At process 208, after the first inorganic layer 308 is formed on the substrate 100, a hybrid layer 312 is then formed on the first inorganic layer 308 on the substrate 100, as shown in FIG. 3B. A first portion 312a of the hybrid layer 312 may be deposited on the substrate 100 through the opening 307 of the mask 309 on the region of the substrate 100 exposed by the mask 309, covering the first portion 308a of first the inorganic layer 308. A second portion 312b of the hybrid layer 312 is deposited on the second portion 308b of the first inorganic layer 308 disposed on the mask 309, which covers the portion 305 of the contact layer 102.

The hybrid layer 312 is a layer of material that is controlled through the deposition process, such as the flow ratio of gases, to be organic and have properties of organic materials, such as acrylate, methacrylate, acrylic acid, or the like, or be inorganic and have properties of inorganic materials, such as those used for the first inorganic layer 308 described above. When the hybrid material is in the inorganic state, it has inorganic material properties, such as density and porosity approximately the same as those of the listed inorganic materials. When the hybrid material is in the organic state, it has organic properties that may include characteristics of organic materials including stress relief, particle conformality, and flexibility approximately the same as those of the listed organic materials. Generally, a hybrid material in its "organic" state is more flexible and less dense than the hybrid material in its "inorganic" state.

An example of a material used in the hybrid layer 312 is plasma-polymerized hexamethyldisiloxane (pp-HMDSO). Deposition of the pp-HMDSO material layer is achieved by flowing an oxygen-containing gas and HMDSO gas. During deposition of the pp-HMDSO layer, the ratio of the flow of oxygen-containing gas to the flow of HMDSO gas is controlled to control the organic/inorganic state and properties of the resulting pp-HMDSO layer.

In one example, the oxygen-containing gas is oxygen gas ($O_2$). A high $O_2$/HMDSO flow ratio (e.g., greater than 10) may be maintained during processing to deposit an inorganic pp-HMDSO layer having characteristics, such as the high density and low porosity barrier properties associated with inorganic films. A low $O_2$/HMDSO flow ratio (e.g, less than 2) may be maintained during processing to deposit an organic pp-HMDSO layer having properties, such as the low stress properties associated with organic films.

Control of the oxygen gas used during deposition of the pp-HMDSO layer can minimize potential reaction with residual silane if present in the gas line or inlet of the deposition chamber. The reaction between the oxygen gas and residual silane can result in undesirable particle formation in the pp-HMDSO layer, which has the potential for contaminating the final OLED device. One method of minimizing the potential for reaction with silane is to perform a gas-line purge between deposition processes. Alternatively, other gases such as nitrous oxide, which are less reactive with silane relative to oxygen gas, may be used. It has been found that the use of nitrous oxide gas ($N_2O$) as the oxygen-containing gas results in minimal reaction with residual silane, thereby reducing, if not eliminating, the need to thoroughly purge the gas lines and chamber after use of silane within the chamber. Thus, a high-quality pp-HMDSO layer can be deposited without any intervening purge process between the inorganic layer deposition process 206 and the hybrid layer deposition process 208.

Therefore, in one example the oxygen-containing gas is nitrous oxide gas. A high $N_2O$/HMDSO flow ratio (e.g., greater than 10) may be maintained during processing to deposit a relatively inorganic pp-HMDSO layer having characteristics, such as the high density and low porosity barrier properties associated with inorganic films. A low $N_2O$/

HMDSO flow ratio (e.g, less than 2) may be maintained during processing to deposit an organic pp-HMDSO layer having properties, such as the low stress properties associated with organic films.

It has been found that inorganic pp-HMDSO provides an excellent moisture barrier due to its high density and low porosity, even though its water contact angle is low (e.g., below 50 degrees, such as 10 to 30 degrees). It has further been found that although such organic pp-HMDSO exhibits excellent flexibility and stress relieving characteristics like the organic materials listed above, the organic pp-HMDSO also has good moisture resistance due to its high water contact angle (e.g., greater than 50 degrees, such as 60 to 99 degrees). In one example, the organic pp-HMDSO has an FTIR of less than 20% of pp-HMDSO in a silicon dioxide network.

In an exemplary embodiment, the processing parameters of the pp-HMDSO layer may include an HMDSO flow rate between about 100 sccm and about 800 sccm, the power density may be between about 0.15 W/cm$^2$ and about 0.75 W/cm$^2$, the pressure may be between about 500 mTorr and about 2000 mTorr, and the spacing may be between about 500 to 1200 mils.

At process 210, a second inorganic layer 314 is formed on the substrate 100, covering the hybrid layer 312 and the first organic layer 308 formed on the OLED structure 104, as shown in FIG. 3C. The second inorganic layer 314 includes a first portion 314a deposited over the first portion 312a of the hybrid layer 312 and a second portion 314b deposited over the second portion 312b of the hybrid layer 312.

The second inorganic layer 314 may be a dielectric layer similar to the first inorganic layer 308. The second inorganic layer 314 is a dielectric layer such as SiN, SiON, SiO$_2$, or other suitable dielectric layers. The second inorganic layer 314 may be deposited by a suitable deposition technique, such as CVD, PVD, spin-coating, or other suitable technique.

The second inorganic layer 314 may be deposited on the substrate 100 using the same mask 309 utilized to deposit the first inorganic layer 308 and the hybrid layer 312. This is possible due to the ability to control the properties, such as hydrophobicity of the hybrid layer 312 to have both good barrier properties (i.e., inorganic state) and good stress relief properties (i.e., organic state). At the same time, the hybrid layer 312, in all regions may be maintained to have adequate hydrophobic properties to ensure good encapsulation of the OLED structure 104 (i.e., density/porosity or water contact angle). Thus, the mask 309 does not have to be changed or removed during the encapsulation sequence.

In one embodiment, the deposition of the hybrid layer 312 is controlled such that deposition of a sublayer adjacent the first inorganic layer 308 and another sublayer adjacent the second inorganic layer 314 is controlled such that the hybrid material in those respective sublayers is inorganic, which enables good adhesion to the first and second inorganic layers 308, 314, respectively. In this embodiment, the hybrid layer 312 is controlled to have a central sublayer that is organic to provide good stress relief between the inorganic sublayers. For example, the deposition of the hybrid layer 312 onto the first inorganic layer 308 is controlled to be inorganic having properties closely matching that of the first inorganic layer (e.g., O$_2$/HMDSO or N$_2$O/HMDSO flow ratio greater than 10). Proceeding upward, the deposition is controlled to have a gradual gradient, wherein the material is increasingly organic (e.g, decreasing O$_2$/HMDSO or N$_2$O/HMDSO flow ratio to less than 2). Continuing upward, the deposition is controlled to have a gradual gradient, wherein the material is increasingly inorganic (e.g., increasing O$_2$/HMDSO or N$_2$O/HMDSO flow ratio) until the material is inorganic having properties closely matching that of the second inorganic layer (e.g., O$_2$/HMDSO or N$_2$O/HMDSO flow ratio greater than 10) are achieved. The deposition gradient may be controlled by analog mode (i.e., continuous modulation), digital mode (i.e., stepwise modulation), or alternating modulation.

Figure 4:
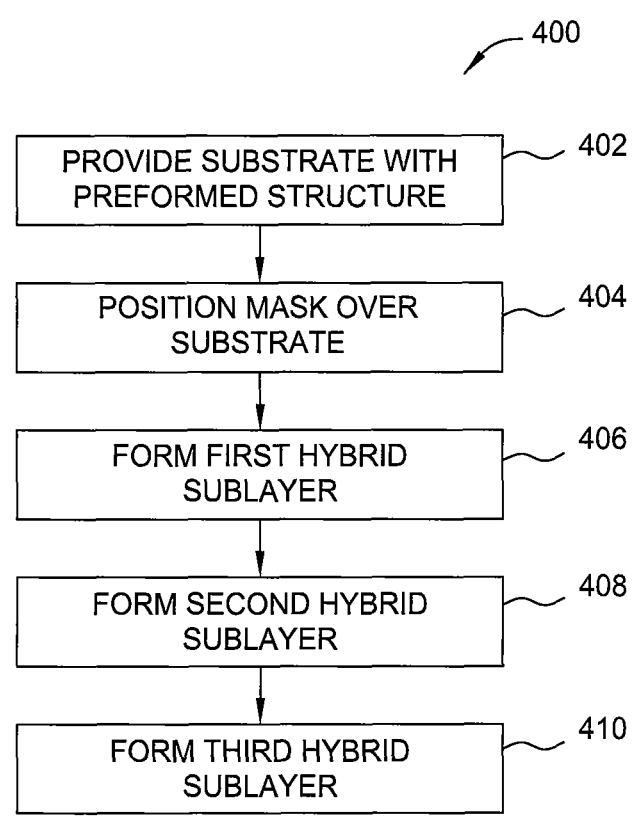
FIG. 4 is a flow diagram of a method for encapsulating an OLED structure in accordance with another embodiment of the present invention.
Figure 5A:
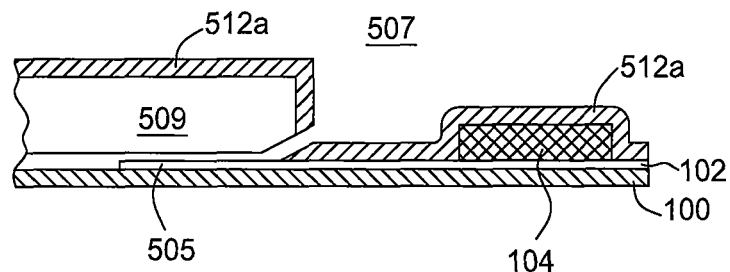
FIGS. 5A-5C illustrate schematic cross-sectional views of an OLED structure during different stages of the method of FIG. 4.
Figure 5B:
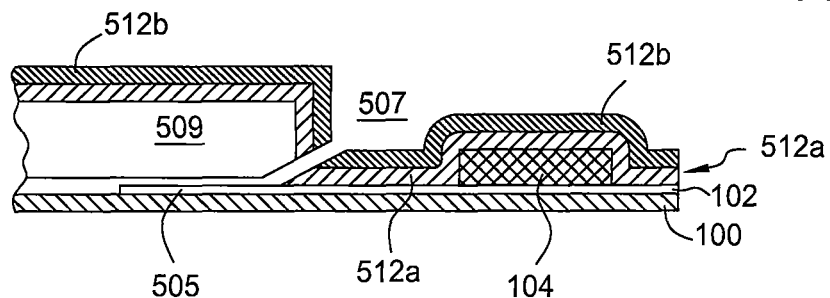
Figure 5C:
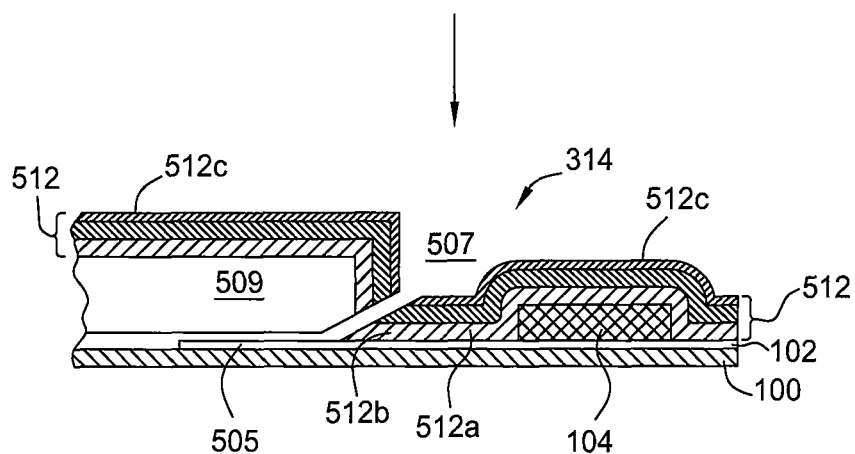

FIG. 4 is a flow diagram of a method 400 for encapsulating an OLED structure disposed on a substrate. FIGS. 5A-C illustrate schematic cross-sectional views of an OLED structure using the encapsulation method 400 of FIG. 4. The method 400 starts at process 402 by providing a substrate having a preformed OLED structure 104 disposed on a substrate 100. Similar to that discussed above, the substrate 100 may have a contact layer 102 disposed thereon, with an OLED structure 104 disposed on the contact layer 102, as shown in FIG. 5A.

At process 404, a mask 509 is aligned over the substrate 100 such that the OLED structure 104 is exposed through an opening 507 unprotected by the mask 509, as shown in FIG. 5A. The mask 509 is positioned such that a portion 505 of the contact layer 102 adjacent to the OLED structure 104 is covered by the mask 509 such that the any subsequently deposited material does not deposit on the portion 505. The mask 509 may be made from a metal material, such as INVAR®.

At processes 406-410, a hybrid layer 512 is deposited on the substrate 100, as shown in FIG. 5C. The hybrid layer 512 is deposited in sublayers 512a-c through the opening 507 onto a region of the substrate 100 exposed by the mask 509, which includes the OLED structure 104 and a portion of the contact layer 102. The hybrid layer 512 is also deposited on the mask 509 covering a second region of the substrate 100, which includes the portion 505 of the contact layer 102.

As previously described with respect to the hybrid layer 312, the hybrid layer 512 is a layer of material that is controlled through the deposition process, such as the flow ratio of gases, to be organic and have properties of organic materials, such as acrylate, methacrylate, acrylic acid, or the like, or inorganic and have properties of inorganic materials, such as those used for the first inorganic layer 308 described above. An example of a material used in the hybrid layer 512 is plasma-polymerized hexamethyldisiloxane (pp-HMDSO). During deposition of the pp-HMDSO film, the ratio of oxygen-containing gas (e.g., O$_2$ or N$_2$O) flow to HMDSO flow may be controlled to control the organic/inorganic properties of the resulting pp-HMDSO film sublayers.

In process 406, a first sublayer 512a of the hybrid layer 512 is deposited as shown in FIG. 5A. During deposition of the first sublayer 512a, the process parameters are controlled such that deposition of the first sublayer 512a is relatively inorganic having material properties matching those of the inorganic materials described above to provide good barrier properties to the hybrid layer 512. For example, the first sublayer 512a of the hybrid layer 512 may be deposited with a high O$_2$/HMDSO or N$_2$O/HMDSO flow ratio (e.g., greater than 10) to provide a pp-HMDSO layer with good barrier properties (e.g., high density, low porosity).

In process 408, a second sublayer 512b of the hybrid layer 512 is deposited as shown in FIG. 5B. During deposition of the second sublayer 512b, the process parameters are controlled such that deposition of the second sublayer 512b is organic having properties matching those of the organic materials described above to provide good stress relief between sublayers 512a and 512c. For example, the second sublayer 512b of the hybrid layer 512 may be deposited with a low O$_2$/HMDSO or N$_2$O/HMDSO flow ratio (e.g., less than 2) to provide a pp-HMDSO layer that is organic with organic properties and high water contact angle (e.g., greater than 50 degrees).

In process 410, a third sublayer 512c of the hybrid layer 512 is deposited as shown in FIG. 5C. During deposition of the third sublayer 512c, the process parameters are controlled such that deposition of the third sublayer 512c is inorganic and has properties matching those of the inorganic materials described above to provide good barrier properties to the hybrid layer 512. For example, the third sublayer 512c of the hybrid layer 512 may be deposited with a high $O_2$/HMDSO or $N_2O$/HMDSO flow ratio (e.g., greater than 10) to provide a relatively inorganic pp-HMDSO layer with good barrier properties and with a low contact angle (less than 50 degrees).

Although deposition of the hybrid layer 512 is depicted and described above in three distinct sublayers, the deposition of the hybrid layer may be controlled more smoothly to deposit the hybrid layer 512 in a single layer with a gradient starting as inorganic at the first sublayer 512a. The deposition parameters may then be gradually changed to provide a smooth (continuous or stepwise) gradient of material with increasingly organic properties (e.g., by decreasing the $O_2$/HMDSO or $N_2O$/HMDSO flow ratio) until the sublayer 512b is organic. Then, the deposition parameters may be gradually changed to provide a smooth (continuous or stepwise) gradient of material with increasingly that is increasing inorganic (e.g., by increasing the $O_2$/HMDSO or $N_2O$/HMDSO flow ratio) until the sublayer 512c is inorganic.

In an exemplary embodiment, the processing parameters of the pp-HMDSO layer may include an HMDSO flow rate between about 100 sccm and about 800 sccm, the power density may be between 0.15 W/cm$^2$ and about 0.75 W/cm$^2$, the pressure may be between about 500 mTorr and about 2000 mTorr, and the spacing may be between about 500 to 1200 mils.

Thus, methods and apparatus for forming encapsulation layers on an OLED structure are provided. By utilizing a hybrid layer during the encapsulation formation process, a single mask may be used, thereby advantageously lowering the manufacture cost as compared to the conventional two hard mask deposition processes while increasing the manufacture throughput. It should be noted that although the embodiments described herein depict a single stack of encapsulation layers/sublayers, multiple stacks of encapsulation layers/sublayers may be used without deviating from the scope of the invention.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an encapsulating layer on an organic light emitting diode (OLED) substrate, comprising:
   forming a first inorganic layer on a region of a substrate having an OLED structure disposed thereon;
   forming a hybrid layer in physical contact with the first inorganic layer, wherein the hybrid layer comprises:
      a first sublayer having a majority of inorganic materials and a minority of organic materials;
      a middle sublayer having a majority of organic materials and a minority of inorganic materials; and
      a second sublayer having a majority of inorganic materials and a minority of organic materials, wherein the first sublayer, the middle sublayer, and the second sublayer are formed by supplying a processing gas comprising a HMDSO gas during the formation of each of the first sublayer, the middle sublayer, and the second sublayer; and
   forming a second inorganic layer in physical contact with the hybrid layer.

2. The method of claim 1, wherein the hybrid layer comprises plasma-polymerized hexamethyldisiloxane (pp-HMDSO).

3. The method of claim 1, wherein the first sublayer is formed by providing an oxygen-containing gas to the HMDSO gas at a flow ratio of about 10 or greater.

4. The method of claim 3, wherein the middle sublayer is formed by providing an oxygen-containing gas to the HMDSO gas at a flow ratio of less than about 2.

5. The method of claim 4, wherein the second sublayer is formed by providing an oxygen-containing gas to the HMDSO gas at a flow ratio of about 10 or greater.

6. The method of claim 5, wherein the oxygen-containing gas is selected from a group consisting of oxygen gas and nitrous oxide gas.

7. The method of claim 1, wherein the first inorganic layer comprises material selected from a group consisting of silicon nitride, silicon oxynitride, silicon dioxide, aluminum oxide, and aluminum nitride.

8. The method of claim 1, further comprising positioning a mask on the substrate prior to forming the layers on the substrate, wherein each layer is formed through an opening in the mask.

9. A method for forming an encapsulating layer on an organic light emitting diode (OLED) substrate, comprising:
   forming a first sublayer of a hybrid layer having a majority of inorganic materials and a minority of organic materials on a region of a substrate having an OLED structure disposed thereon by providing an oxygen-containing gas to a HMDSO gas at a flow ratio of about 10 or greater;
   forming a middle sublayer of the hybrid layer having a majority of organic materials and a minority of inorganic materials in physical contact with the first sublayer by decreasing the flow ratio of the oxygen-containing gas to the HMDSO gas to less than about 2; and
   forming a second sublayer of the hybrid layer having a majority of inorganic materials and a minority of organic materials in physical contact with the middle sublayer by increasing the flow ratio of the oxygen-containing gas to the HMDSO gas to about 10 or greater.

10. The method of claim 9, further comprising positioning a mask on the substrate prior to forming the sublayers on the substrate, wherein each sublayer is formed through an opening in the mask.

11. The method of claim 9, wherein the hybrid layer comprises plasma-polymerized hexamethyldisiloxane (pp-HMDSO).

12. The method of claim 9, wherein the oxygen-containing gas is selected from a group consisting of oxygen gas and nitrous oxide gas.

13. A method for forming an encapsulating layer on an organic light emitting diode (OLED) substrate, comprising:
   forming a first inorganic layer on a region of a substrate having an OLED structure disposed thereon;
   forming a hybrid layer on the first inorganic layer, wherein the hybrid layer comprises:
      a first sublayer having a majority of inorganic materials and a minority of organic materials;
      a middle sublayer having a majority of organic materials and a minority of inorganic materials; and a second sublayer having a majority of inorganic materials and a minority of organic materials, wherein the first sublayer, the middle sublayer, and the second sublayer are all formed by supplying a processing gas comprising a HMDSO gas during the formation of each of the first sublayer, the middle sublayer, and the second sublayer; and forming a second inorganic layer on the hybrid layer.

* * * * *